(12) United States Patent
Laermer et al.

(10) Patent No.: US 6,303,512 B1
(45) Date of Patent: Oct. 16, 2001

(54) ANISOTROPIC, FLUORINE-BASED PLASMA ETCHING METHOD FOR SILICON

(75) Inventors: Franz Laermer, Stuttgart; Andrea Schilp, Schwaebisch, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/171,516

(22) PCT Filed: Feb. 13, 1998

(86) PCT No.: PCT/DE98/00421

§ 371 Date: Apr. 29, 1999

§ 102(e) Date: Apr. 29, 1999

(87) PCT Pub. No.: WO98/37577

PCT Pub. Date: Aug. 27, 1998

(30) Foreign Application Priority Data

Feb. 20, 1997 (DE) .............................................. 197 06 682

(51) Int. Cl.$^7$ ................................................ H01L 21/3065
(52) U.S. Cl. .......................... 438/712; 438/714; 438/723; 438/724; 438/725; 438/733
(58) Field of Search .................... 438/706, 707, 438/712, 714, 715, 717, 723, 724, 725, 733

(56) References Cited

U.S. PATENT DOCUMENTS

| 4,943,344 | | 7/1990 | Tachi et al. . | |
|---|---|---|---|---|
| 5,100,505 | | 3/1992 | Cathey, Jr. . | |
| 5,354,416 | | 10/1994 | Okudaira et al. . | |
| 5,409,563 | * | 4/1995 | Cathey ................... | 438/715 |
| 5,429,070 | * | 7/1995 | Campbell et al. ............... | 118/723 R |
| 5,447,598 | * | 9/1995 | Mihara et al. ......................... | 216/46 |
| 5,750,211 | * | 5/1998 | Weise et al. ......................... | 427/579 |
| 5,843,847 | * | 12/1998 | Pu et al. ................................. | 438/723 |
| 5,871,659 | * | 2/1999 | Sakano et al. .......................... | 216/79 |

FOREIGN PATENT DOCUMENTS

| 44 20 962 | 12/1995 | (DE) . |
|---|---|---|
| 414 372 | 2/1991 | (EP) . |

* cited by examiner

Primary Examiner—Robert Kunemund
Assistant Examiner—Binh X. Tran
(74) Attorney, Agent, or Firm—Kenyon & Kenyon

(57) ABSTRACT

A method for anisotropic plasma etching of laterally defined patterns in a silicon substrate is described. Protective layers made of at least one silicon compound with a second reaction partner that is entirely compatible with the chemistry of the etching process are deposited before and/or during plasma etching onto the sidewalls of the laterally defined patterns.

25 Claims, 2 Drawing Sheets

ANISOTROPIC, FLUORINE-BASED PLASMA ETCHING METHOD FOR SILICON

FIELD OF THE INVENTION

The invention proceeds from a method for anisotropic plasma etching of laterally defined patterns in a silicon substrate.

BACKGROUND OF THE INVENTION

The configuration of patterns, for example recesses, in a silicon substrate using the plasma etching method is known. It is also known, for example for applications in micromechanics, to use fluorine compounds for anisotropic plasma etching. The fluorine radicals generated in the plasma act isotropically be with respect to silicon, however; i.e. the lateral etching rate corresponds substantially to the vertical one, which leads to correspondingly large mask undercuts and rounded profile shapes. In order to achieve a vertical sidewall with an etching method that uses fluorine compounds, precautions must additionally be taken in order to protect the sidewall selectively from etching attack, and to confine the etching to the pattern front, i.e. the bottom of the recess. Discrimination between the sidewall of the recess and the etching front is attained via a highly oriented vertical incidence of energetic ions, which are produced simultaneously in the plasma alongside the chemically active neutral radicals. The ions strike the surface of the substrate, the etching front being bombarded strongly by ions but the sidewalls of the recess, on the other hand, only relatively weakly. It is known to use polymer-forming gases such as $CHF_3$, which are mixed directly with the fluorine-supplying etching gas, as the protective mechanism for the sidewalls. A polymer layer is deposited onto the sidewall from the polymer-forming monomers present in the plasma, while the fluorine radicals produced in the plasma at the same time etch the silicon substrate on the etching front, which is polymer-free because of the incidence of ions. It is disadvantageous that intensive recombination occurs, in the plasma and on the way to the substrate being etched, between unsaturated polymer-forming monomers and the fluorine radicals. To overcome this disadvantage, it is known to prevent the disruptive recombination of unsaturated polymer-forming monomers and the fluorine radicals capable of silicon etching by separating the plasma etching process into etching steps in which exclusively fluorine-supplying gases are used, and deposition steps in which exclusively deposition gases, such as the polymer-forming gases, are used. Because they are used in the plasma on a temporally separated basis, the two varieties of gas used do not encounter one another, so that appreciable recombination also cannot occur.

It is also known to passivate the sidewalls by using in the plasma, alongside the etching fluorine radicals, oxygen radicals or nitrogen radicals which convert the silicon of the sidewall at the surface into silicon oxide or silicon nitride, respectively. Since the dielectric surface is etched particularly strongly by the fluorine radicals with ion assistance and less strongly without ion assistance, etching proceeds essentially on the etching front, while the sidewall remains relatively protected. One substantial disadvantage of this method is that the silicon oxide or nitride layers generated at the surface are of only atomic thickness, i.e. are on the order of 1 nm thick or less. The silicon oxide or nitride layers generated at the surface therefore do not seal very well, and offer only incomplete protection. The result is that process control becomes more difficult, and that the process result is greatly influenced by secondary effects. The profile shapes of the patterns to be formed are never completely vertical, since sidewall attacks and thus also mask edge undercuts always occur. Cryogenic methods are used in order to increase the effectiveness of this passivation: cooling the silicon substrate to temperatures as low as −100° C., in addition to oxygen or nitrogen passivation, "freezes out" the sidewall reaction. This method is described in U.S. Pat. No. 4,943,344. Disadvantages include the highly complex equipment and the costs associated therewith, as well as the comparatively poor reliability of the components.

SUMMARY OF THE INVENTION

The present invention concerns a method for anisotropic plasma etching of laterally defined patterns in a silicon substrate, protective layers made of at least one silicon compound being deposited before and/or during plasma etching onto the sidewalls of the laterally defined patterns. In a particularly advantageous exemplary embodiment, the present invention provides for depositing silicon oxide layers and/or silicon nitride layers onto the sidewalls of the laterally defined structures, in particular beams, trenches, combs, or tongues. The patterns are preferably defined with the aid of an etching mask. The procedure according to the present invention leads, advantageously, to a thick (i.e. from several nm to several tens of nm thick) silicon oxide or silicon nitride layer on the sidewalls of the pattern. Even at room temperature, this protective layer withstands the etching attack of the radicals formed in the plasma, in particular the fluorine radicals that are preferably used, and thus makes possible a particularly reliable etching operation which is resistant to malfunction. Advantageously, the method can also be carried out at lower substrate temperatures; a specific parameter range of the gas composition leading to the production of vertical etching profiles is to be used at each substrate temperature.

The present invention advantageously provides for the etching gas which releases fluorine radicals in the plasma to be sulfur hexafluoride $SF_6$ or nitrogen trifluoride $NF_3$, optionally as a mixture together with argon. In order to make available the components which form the protective layer, oxide formers and/or nitride formers as well as a secondary reactant are added to the etching gas which supplies the fluorine radicals. Oxygen $O_2$, dinitrogen oxide $N_2O$, a different nitrogen oxide NO, $NO_x$, carbon dioxide $CO_2$, or nitrogen $N_2$ are added as oxide formers or nitride formers. The invention advantageously provides, when $NF_3$ is used as the etching gas, for no separate nitride formers to be used, since the nitrogen released during dissociation of the etching gas $NF_3$ serves for nitrification. Advantageously, silicon tetrafluoride $SiF_4$ is used as the secondary reactant, i.e. as the compound which supplies the silicon component of the protective layer. According to the present invention, the reaction product $SiO_2$, $Si_xN_y$, or a mixture made up of $Si_xO_yN_z$, is deposited onto the sidewall of the pattern from the secondary reactant, i.e. preferably $SiF_4$, and the reaction partner (oxygen or nitrogen) deriving from the oxide former or nitride former. The secondary reactant $SiF_4$ does not react with the fluorine radicals deriving from $SF_6$ dissociation, but only with oxygen or nitrogen, fluorine radicals in fact additionally being released ($SiF_4+O_2<==>SiO_2+4F^*$; $SiF_4+xO^*<==>SiO_xF_{4-x}+xF^*$).

It is also possible to separate the plasma etching according to the present invention into etching and deposition steps that are separated from one another, only etching being conducted during the etching step, and the deposition of the silicon compound described above being performed during the deposition step. In particularly preferred fashion, the etching steps are performed alternately with the deposition steps.

The affinity of the oxide formers or nitride formers preferred according to the present invention for the secondary reactant, i.e. preferably $SiF_4$, is low enough that in the gas phase, in particular under the low process pressures that are preferred according to the present invention and the process conditions provided according to the present invention, especially the excess of free fluorine radicals in the plasma, no appreciable reaction takes place between the oxide formers or nitride formers and the secondary reactants, even with high-density plasma excitation. The advantageous result is to prevent any reaction from already occurring in the gas phase, for example between an oxide former and $SiF_4$, to form $SiO_2$; the resulting solid would precipitate onto the surface of the substrate and might result there in micromasking with etching front roughness, or in needle formation. The low process pressure provided according to the present invention results, by way of long free path lengths, in a reduction in reaction probability in the gas phase, and in a reduction in microloading effects during silicon etching in narrow trenches.

The present invention thus advantageously leads to the deposition of etch-resistant silicon compounds on the sidewalls of the laterally defined patterns, which act as a protective layer. In the course of the method according to the present invention, activated silicon fluoride compounds and oxygen radicals or nitrogen radicals, as well as a high concentration of fluorine radicals, continuously strike the silicon surface. The result is to form a thick dielectric layer at those locations where the intensive ion effect advantageously provided according to the present invention does not occur, i.e. on the sidewalls. On ion-bombarded surfaces, i.e. at the bottom of the patterns, in particular of recesses, or at the etching front, the influence of the fluorine radicals and the etching reaction predominate, so that the silicon substrate is removed there. The present invention thus makes available a passivating system for the sidewalls of laterally defined patterns that is compatible with the reactive fluorine radicals without particular additional measures.

In an exemplary advantageous embodiment, the present invention provides for carrying out the method using a high-density plasma source, for example PIE (propagation ion etching), ICP (inductively coupled plasma), or ECR (electron cyclotron resonance), thus making it possible to use high flow rates of etching and passivating species as well as low-energy ions. A high etching rate and mask selectivity are thereby obtained, ultimately leading to high silicon removal accompanied by low mask material removal.

The present invention advantageously provides for accelerating the breakdown of silicon compounds, preferably $SiO_2$, which are possibly deposited on the etching front by adding so-called $SiO_2$ scavenger gases such as $CHF_3$, $C_4F_8$, $CF_4$, $C_2F_6$, or $C_3F_6$ to the gas mixture. Because of their carbon content, the $SiO_2$ scavenger gases etch $SiO_2$ particularly well with simultaneous ion action. A clean etching front and even higher etching rates are thus obtained. Needle formation on the etching front is moreover prevented. These scavenger (i.e. oxide-consuming) gases can be added continuously to the plasma as a constant admixture, or can be admitted from time to time or periodically over a short period so as to remove, during a "flash" of this kind, oxide contaminants on the etching front.

The present invention provides in particularly advantageous fashion for plasma etching to be carried out with simultaneous ion irradiation, the ion energy used preferably being 1 to 100 eV, in particular 30 to 50 eV.

The media used for plasma etching preferably have gas flow rates of 10 to 200 sccm at a process pressure of 1 to 50 $\mu$bar.

In a further advantageous exemplary embodiment, the present invention provides for plasma generation to be accomplished by microwave irradiation or high-frequency irradiation, at power levels of 500 to 2000 W.

The present invention provides, in particular, for the ion density, the ion energy, and the ratio between charged and uncharged particles to be controlled independently of one another.

In an exemplary advantageous embodiment, the present invention provides for the gas flow rate for $SF_6$ to be set at 20 to 200 sccm.

The present invention also provides for the gas flow rate for $SiF_4$ to be set at 10 to 50 sccm.

In a further exemplary embodiment, the present invention provides for the gas flow rate for oxygen to be set at 10 to 100 sccm, and the gas flow rate for the $SiO_2$ scavenger gases, in particular $C_4F_8$, to be set at 2 to 10 sccm for a continuous gas flow. With a pulsed scavenger gas flow, a higher value can be selected for this flow rate, for example 30 to 60 sccm $C_4F_8$ every 30 to 60 seconds, for a period of 5 seconds each time. Pulsing of the scavenger flow introduces into the process short cleaning steps which, with a correspondingly higher flow, yield a short-term intensive cleaning effect without interfering with the profile shape. Since the scavenger is present only briefly, it cannot disadvantageously influence the etching profile, but it can nevertheless effectively remove contaminants from the etching front. On the etching front, the intensive ion incidence causes contaminants to be removed more is quickly than the scavenger can create a breakdown through the (protective) sidewall oxide.

In a further embodiment, the present invention provides for a high-frequency power of 5 to 50 W to be made available for ion it acceleration at the substrate electrode, corresponding to acceleration voltages of 20 to 150 V.

DETAILED DESCRIPTION

Figure 1:
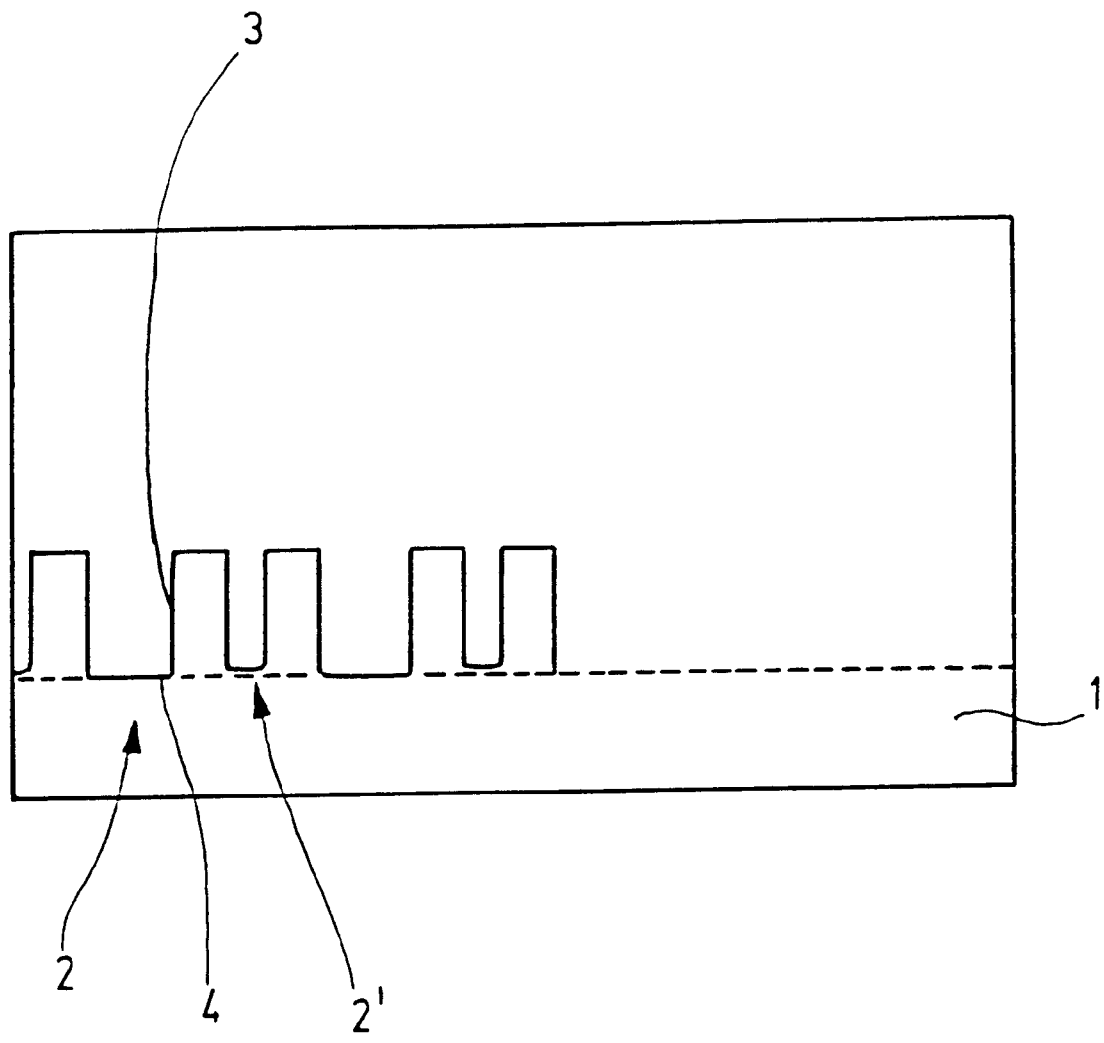
FIG. 1 shows a longitudinal section through a silicon substrate with lateral patterns.

FIG. 1 shows a pattern, produced using the plasma etching method according to the present invention, in a silicon substrate.

It shows a substrate 1 having a recess 2 defined by sidewalls 3. Also depicted is etching front 4 and a narrow recess 2'.

The method for anisotropic plasma etching of laterally defined recesses 2, 2' in a silicon substrate 1 was carried out with the etching gas $SF_6$ and a gas flow rate of 75 sccm ($SF_6$). $O_2$ with a gas flow rate of 38 sccm was used as the oxide former, and $SiF_4$ with a gas flow rate of 38 sccm as the secondary reactant. Deposition of the protective layer, i.e. the silicon compound $SiO_2$, automatically occurred simultaneously with the plasma etching. The temperature of substrate 1 was 10° C. The process pressure was 20 $\mu$bar, and the PIE source that was used supplied a microwave power level of 650 W (2.45 GHz). To generate an ion acceleration voltage, a high-frequency power level of 5 W (13.56 MHz) was used at the substrate electrode, the ion acceleration energy (DC bias) being 40 V.

FIG. 1 shows that with the process conditions recited above, vertical sidewalls 3 of recesses 2, 2' were advantageously produced in substrate 1. In particularly advantageous manner, extremely small differences in etching rate occur between wide recesses 2 and narrow recesses 2'.

Figure 2:
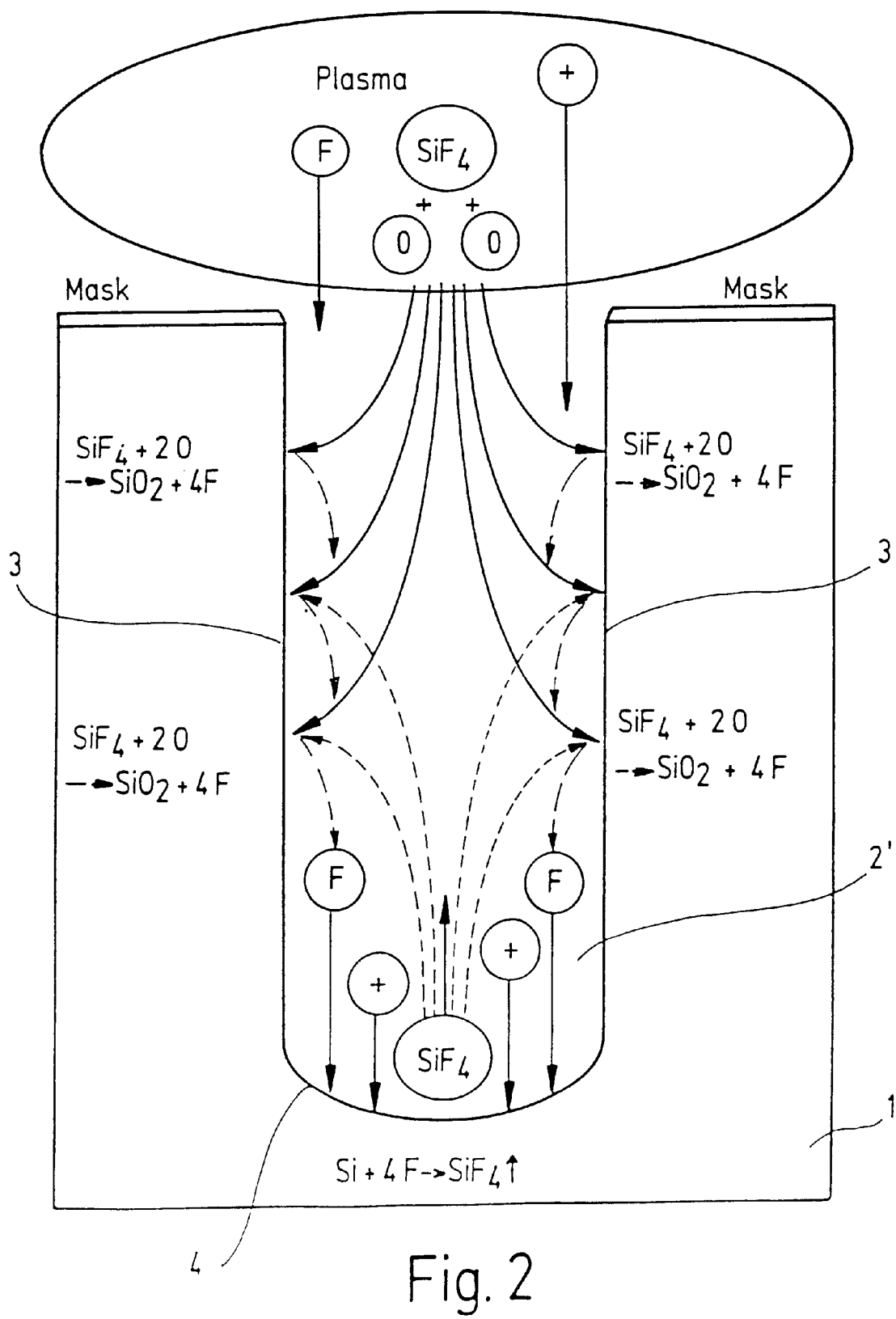
FIG. 2 shows an illustration of the principle of the etching process.

FIG. 2 depicts the principle of the etching process. Identical parts are given the same reference numbers as in FIG. 1. Substrate 1, into which a lateral recess 2' is being introduced by the etching process, is depicted. For passivation of the sidewalls, silicon tetrafluoride $SiF_4$ and oxygen, which ensure fluorine-compatible sidewall passivation, are introduced into the plasma in addition to the fluorine radicals and positively charged ions formed therein. At etching front 4, ion assistance results in the reaction of silicon and fluorine radicals to form volatile silicon tetrafluoride, which departs from the etching front; this represents the desired etching reaction. Etching occurs spontaneously at etching front 4, and thus requires no ion assistance per se. The high ion incidence there, however, suppresses the formation of silicon oxides or oxyfluorides which inhibit etching.

On sidewalls 3, on the other hand, which are exposed only to a relatively small ion bombardment, a reaction can take place between silicon tetrafluoride and oxygen to yield an etch-inhibiting silicon oxide or silicon oxyfluoride, which deposits onto sidewalls 3 as a film. A small proportion of the silicon tetrafluoride formed on the etching front, which is attempting to depart from the trench, is consumed in a back-reaction for film formation on sidewalls 3, as indicated by the dashed lines in FIG. 2. The major proportion of the silicon tetrafluoride required to form the sidewall film is supplied, however, from the plasma chemistry, i.e. silicon tetrafluoride is introduced into the plasma as the essential passivating gas together with oxygen, as indicated in FIG. 2 by the solid lines. As is evident from FIG. 2, this film-forming reaction in fact additionally causes the $SiF_4$ to release fluorine, which can additionally assist the etching reaction on the etching front. The microloading and RIE lag, i.e. the decrease in etching rate in narrow trenches as compared with wide ones, are relatively moderate because additional fluorine is formed in the trench by the wall film-forming reaction.

In a further exemplary embodiment, the following advantageous parameters were found under ICP (inductively coupled plasma) excitation conditions using high-frequency excitation. Gas flow rates were 40 sccm $SF_6$, 60 sccm $O_2$, 21 sccm $SiF_4$, and 5 sccm $C_4F_8$ as a constant gas flow rate. The pressure was 15 mTorr=20 izbar, ICP high-frequency power was 800 W at 13.56 MHz, and substrate (bias) power was 10 to 15 W at 13.56 MHz. The bias voltage was set at 40 to 100 V. With a pulsed $C_4F_8$ flow, the following gas flow rates were set: 40 sccm $SF_6$, 60 sccm $O_2$, 21 sccm $SiF_4$, and 30–60, preferably 45, sccm $C_4F_8$. The $C_4F_8$ was delivered periodically every 30–60 seconds, preferably every 45 seconds, for a period of 5 seconds each time. ICP high-frequency power in this case was 800 W, and substrate power 12 W.

What is claimed is:

1. A method for anisotropic plasma etching laterally defined patterns in a silicon substrate, comprising the steps of:

anisotropic plasma etching the laterally defined patterns in the silicon substrate using an etching gas to release flourine radicals in a plasma; and before the etching step or during the etching step, depositing protective layers onto sidewalls of the laterally defined patterns, the protective layers being formed by at least one silicon compound being used as a secondary reactant, and using at least one of an oxide former and a nitride former, wherein the secondary reactant does not substantially react with the flourine radicals released from the etching gas, and the secondary reactant does react with at least one of oxygen from the oxide former and nitrogen from the nitride former, and the etching gas;

wherein the etching gas, the at least one of the oxide former and the nitride former, and the secondary reactant are each bromine-free and chlorine-free.

2. The method according to claim 1, wherein the etching step and the depositing step are performed separate from one another, the etching step being performed alternately with the depositing step.

3. The method according to claim 1, wherein the etching step is performed using a medium, the medium having a gas flow rate between 10 sccm and 200 sccm and a process pressure between 1 $\mu$bar and 50 $\mu$bar.

4. The method according to claim 1, further comprising the step of:

during the etching step, cooling the silicon substrate.

5. The method according to claim 1, further comprising the step of:

generating an anisotropic plasma using one of a microwave irradiation and a high-frequency irradiation having a power level between 500 W and 2000 W.

6. The method according to claim 1, wherein the etching step is performed simultaneous with an ion irradiation.

7. The method according to claim 6, wherein the ion irradiation has an ion energy between 1 eV and 100 eV.

8. The method according to claim 6, wherein the ion irradiation has an ion energy between 30 eV and 50 eV.

9. The method according to claim 6, wherein an ion density, an ion energy, and a ratio between charged particles and uncharged particles are controlled independently of one another.

10. The method according to claim 1, wherein the at least one silicon compound includes one of silicon oxide, silicon nitride and silicon oxynitride.

11. The method according to claim 10, wherein the depositing step includes depositing one of a silicon oxide layer and a silicon nitride layer onto the sidewalls.

12. The method according to claim 11, wherein the at least one silicon compound further includes $SiF_4$.

13. The method according to claim 11, wherein one of $O_2$, $N_2O$, $NO$, $NO_x$, $CO_2$, and $N_2$ is added to the etching gas.

14. The method according to claim 11, further comprising the step of:

adding at least one of $O_2$ and $N_2$ to the etching gas as a reaction partner.

15. The method according to claim 11, wherein the etching gas provides at least one of $O_2$ and $N_2$ for use as a reaction partner.

16. The method according to claims 11, further comprising the step of:

delivering at least one $SiO_2$ scavenger gas for a short time period and only periodically to the etching gas for intensive cleaning of an etching front, the at least one $SiO_2$ scavenger gas being bromine-free and chlorine-free.

17. The method according to claim 11, wherein a gas flow rate of a silicon tetrafluoride $SiF_4$ is between 10 sccm and 50 sccm.

18. The method according to claim 11, wherein a gas flow rate of $O_2$ is between 10 sccm and 100 sccm.

19. The method according to claim 11, wherein the etching gas includes one of $SF_6$ and $NF_3$.

20. The method according to claim 19, wherein a gas flow rate of the sulfur hexafluoride $SF_6$ is between 20 sccm and 200 sccm.

21. The method according to claim 11, further comprising the step of:

continuously adding at least one $SiO_2$ scavenger gas to the etching gas, the at least one $SiO_2$ scavenger gas being bromine-free and chlorine-free.

22. The method according to claim 21, wherein the at least one $SiO_2$ scavenger gas includes one of $CHF_3$, $CF_4$, $C_2F_6$, $C_3F_6$, and $C_4F_8$.

23. The method according to claim 21, wherein a gas flow rate of the at least one $SiO_2$ scavenger gas is between 2 sccm and 10 sccm.

24. The method according to claim 23, wherein the at least one $SiO_2$ scavenger gas includes $C_4F_8$.

25. The method according to claim 24, further comprising the step of:

adding $C_4F_8$ to the etching gas periodically every 30 seconds to 60 seconds for a period of 5 seconds each time, $C_4F_8$ having a flow rate between 30 sccm and 60 sccm.

* * * * *